(12) United States Patent
Isaksen et al.

(10) Patent No.: US 6,904,098 B1
(45) Date of Patent: Jun. 7, 2005

(54) LINEAR PHASE ROBUST CARRIER RECOVERY FOR QAM MODEMS

(75) Inventors: David Bruce Isaksen, Mountain View, CA (US); Byron Esten Danzer, Aptos, CA (US)

(73) Assignee: Wideband Semiconductors, Inc., Mountain View, CA (US)

( * ) Notice: Subject to any disclaimer, the term of this patent is extended or adjusted under 35 U.S.C. 154(b) by 654 days.

(21) Appl. No.: 09/981,085

(22) Filed: Oct. 16, 2001

(51) Int. Cl.[7] ............................................... H04L 5/12
(52) U.S. Cl. ..................... 375/261; 375/326; 375/327; 375/350
(58) Field of Search ................................. 375/261, 326, 375/327, 350, 354; 329/304, 306, 307

(56) References Cited

U.S. PATENT DOCUMENTS

| | | | | |
|---|---|---|---|---|
| 5,386,239 A | * | 1/1995 | Wang et al. | 348/472 |
| 5,894,334 A | * | 4/1999 | Strolle et al. | 348/725 |
| 6,085,351 A | | 7/2000 | Alberty | |
| 6,668,014 B1 | * | 12/2003 | Endres et al. | 375/232 |
| 2003/0058967 A1 | * | 3/2003 | Lin et al. | 375/327 |

OTHER PUBLICATIONS

Jablon, N. K., "Joint Blind Equalization, Carrier Recovery, and Timing Recovery for Hogh–Order QAM Signal Constellations" IEEE vol. 40, No. 6 Jun. 1992, pp. 1383–1389.*

* cited by examiner

*Primary Examiner*—Don N. Vo
(74) *Attorney, Agent, or Firm*—Boris G Tankhilevich

(57) ABSTRACT

In a QAM demodulator including an adaptive equalizer, a method of carrier tracking comprising the following steps is disclosed: (A) sampling a QAM signal received from a transmission channel; (B) recovering a symbol clock function from the sampled QAM signal; (C) applying the sampled QAM signal to the adaptive equalizer in order to obtain a QAM equalized signal in a Blind Equalization (BE) mode; (D) using a slicer to locate a nearest plant point for the QAM Blind equalized signal for each recovered symbol clock; (E) using a complex conjugate multiplier to obtain an instantaneous inphase component and an instantaneous quadrature component of a phase angle error signal; (F) using a linear phase detector to obtain an instantaneous phase angle error for each symbol clock; (G) averaging the instantaneous phase angle error signal by using a carrier loop filter; (H) using a complex multiplier to insert an inverse of the averaged phase angle error signal into the QAM Blind equalized signal to compensate for the carrier phase angle error; and (I) repeating the steps (D–H) to close a carrier frequency loop.

35 Claims, 11 Drawing Sheets

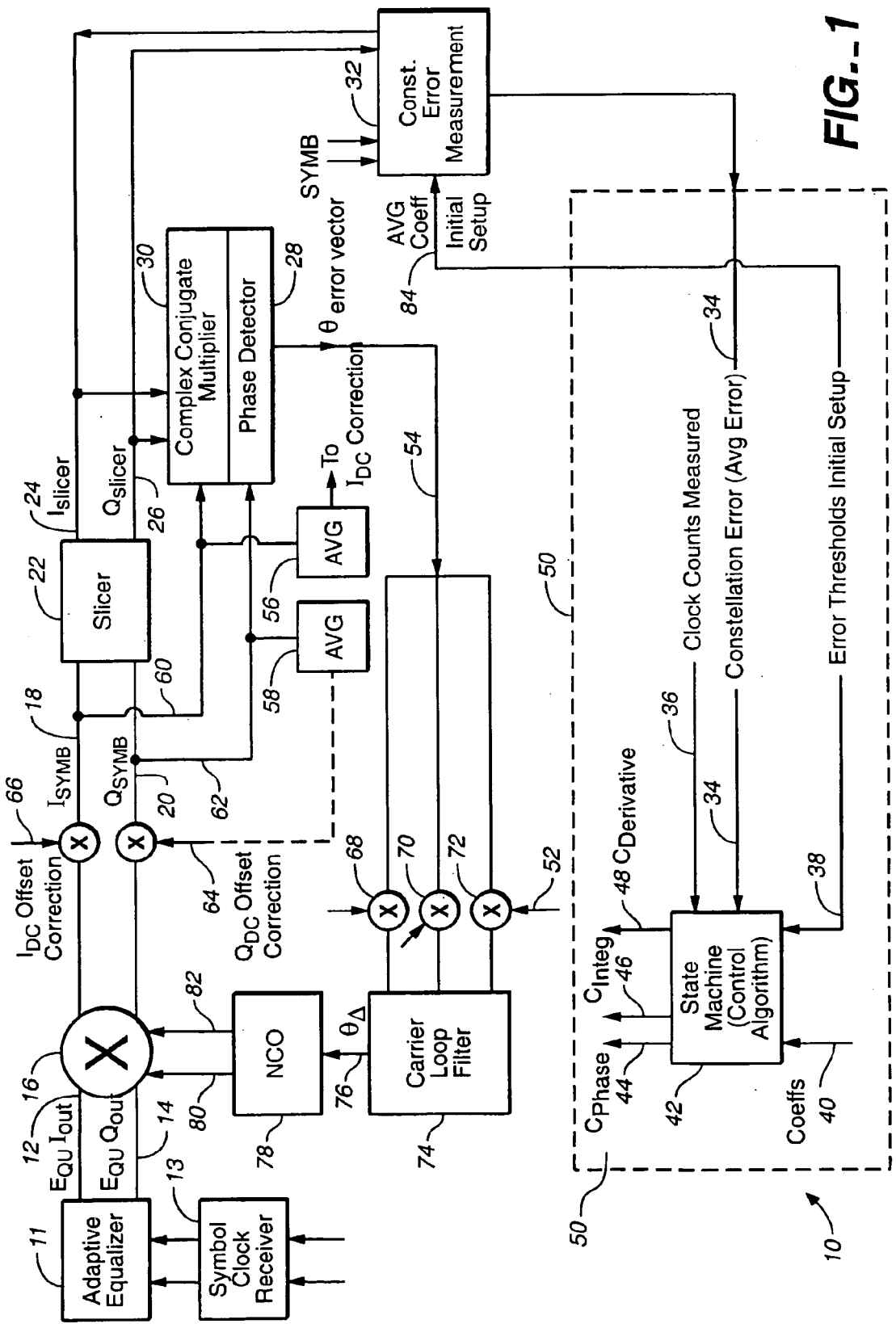
FIG._1

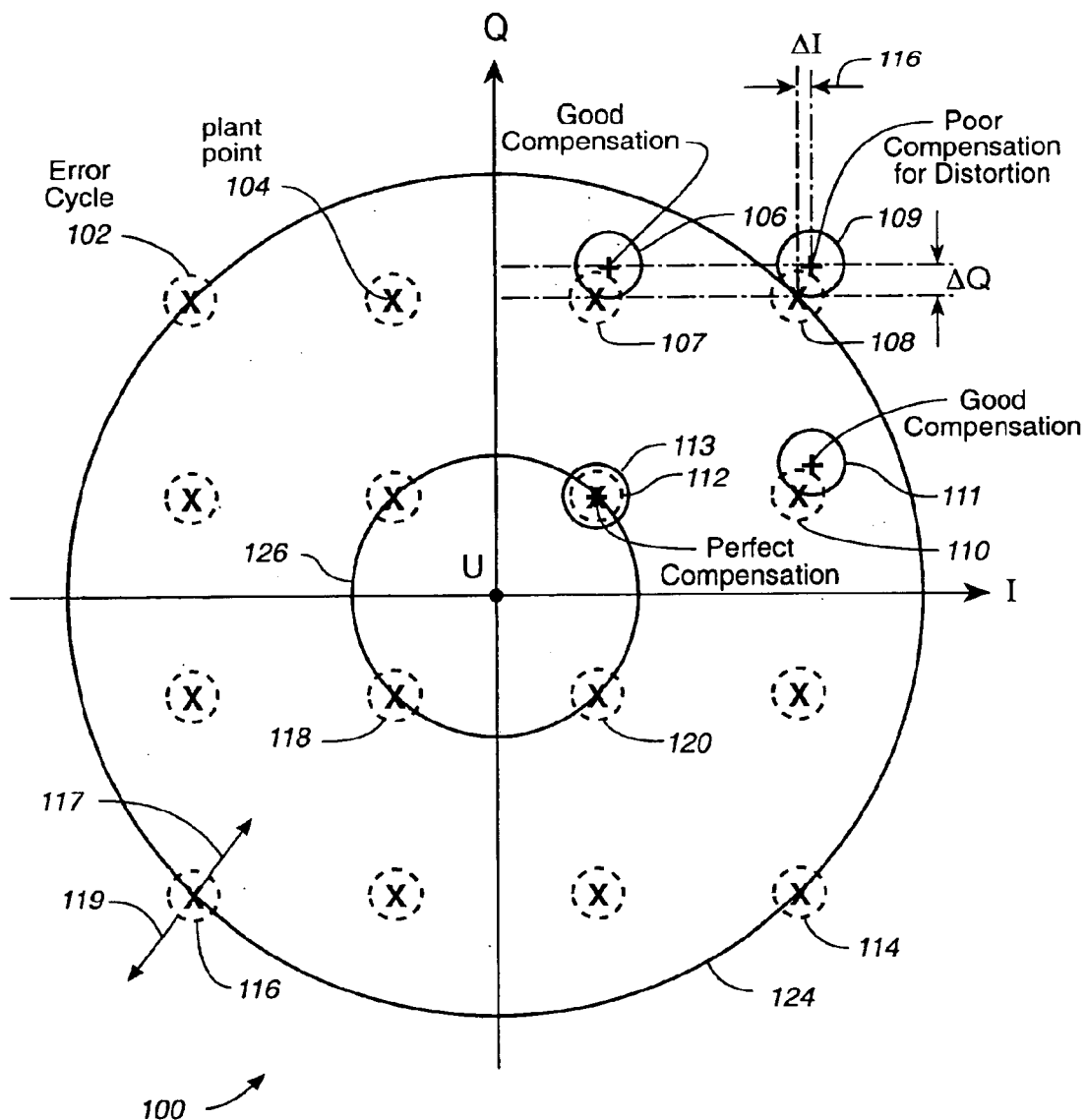
FIG._2

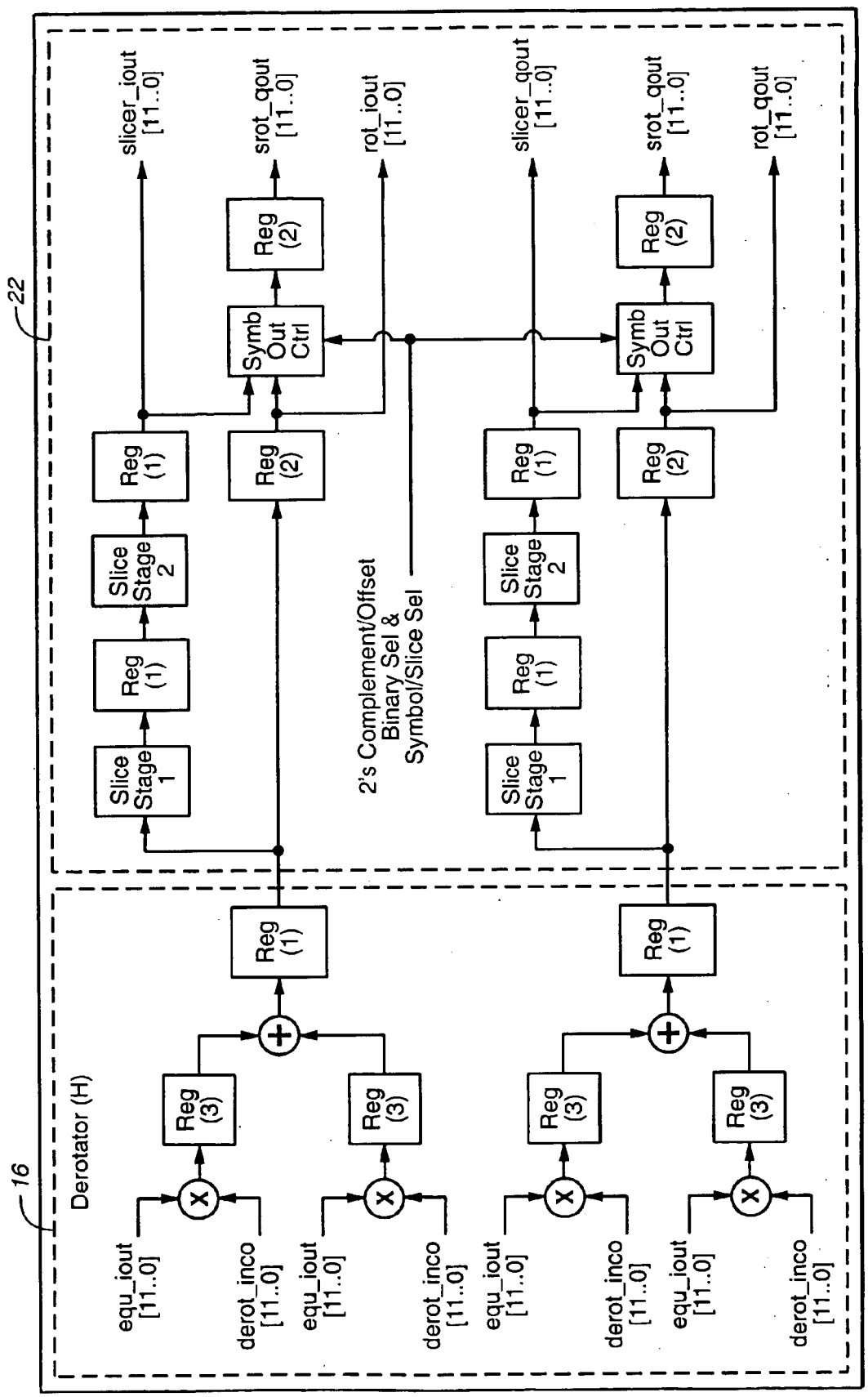
FIG._3

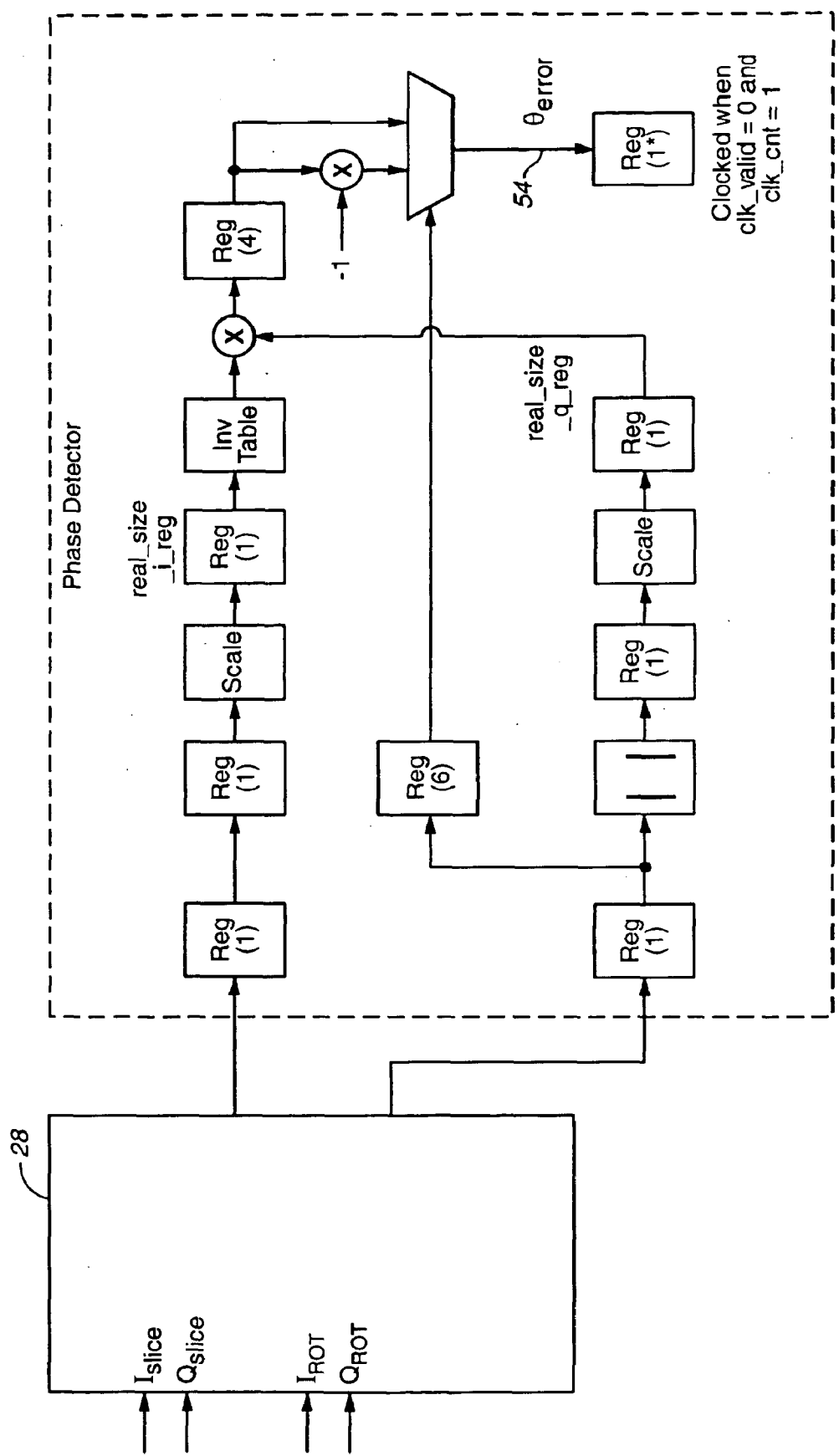
FIG._4

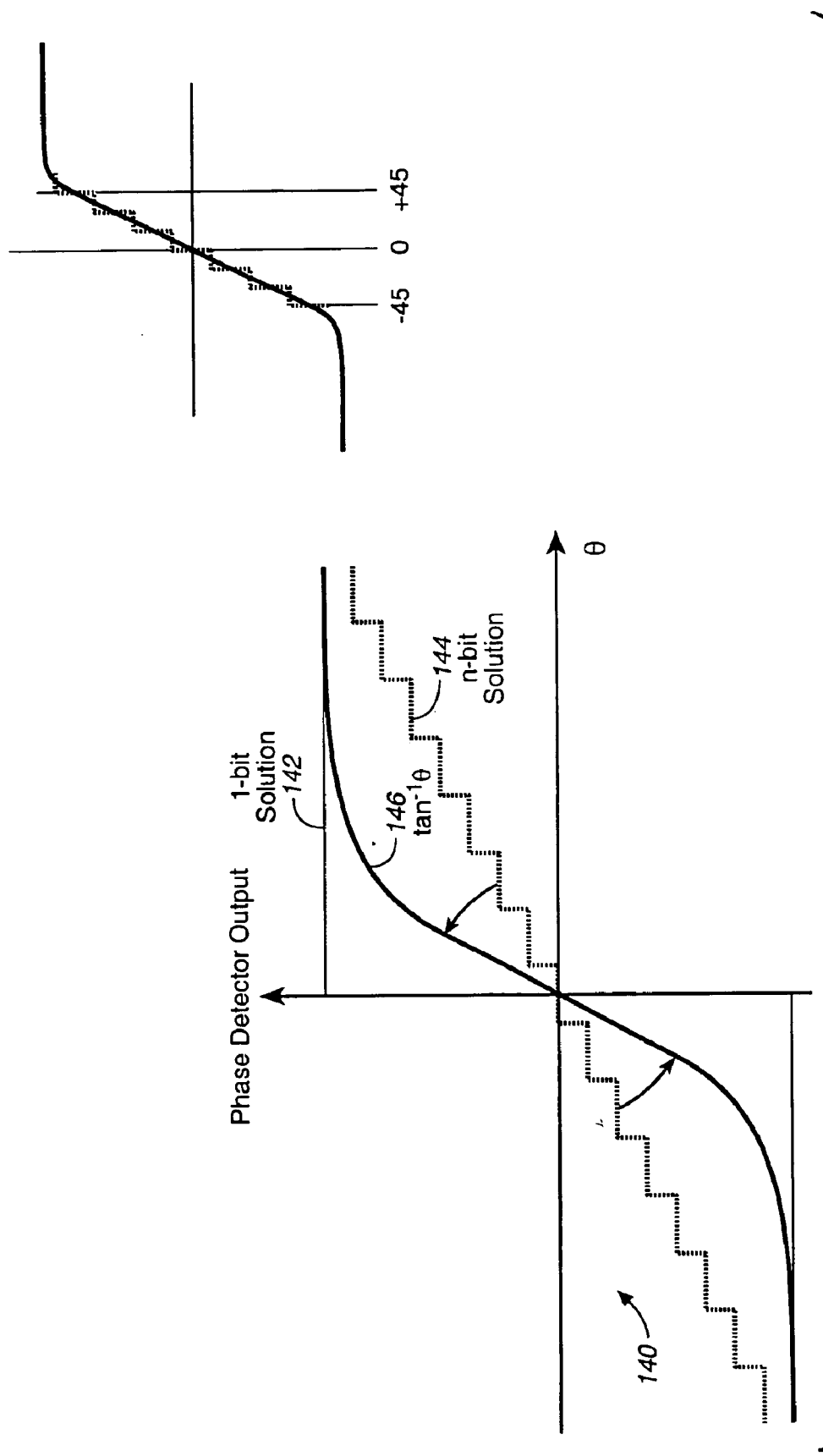
FIG._5A

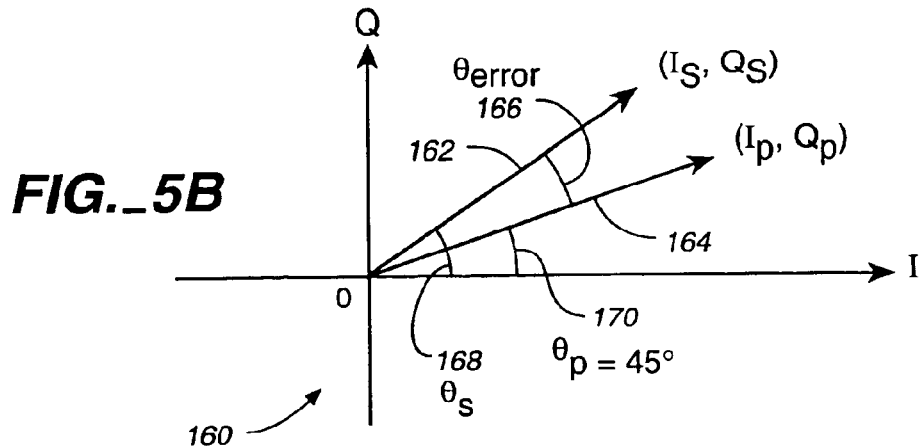
FIG._5B
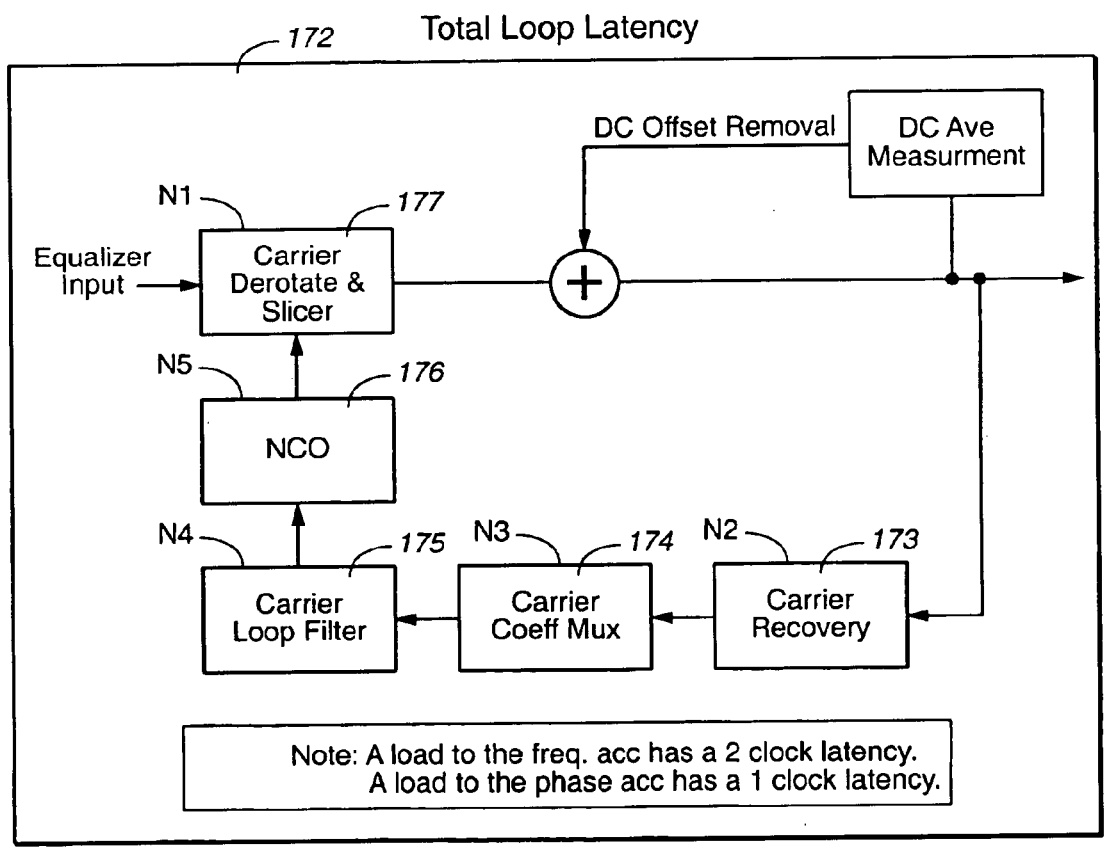
FIG._5C

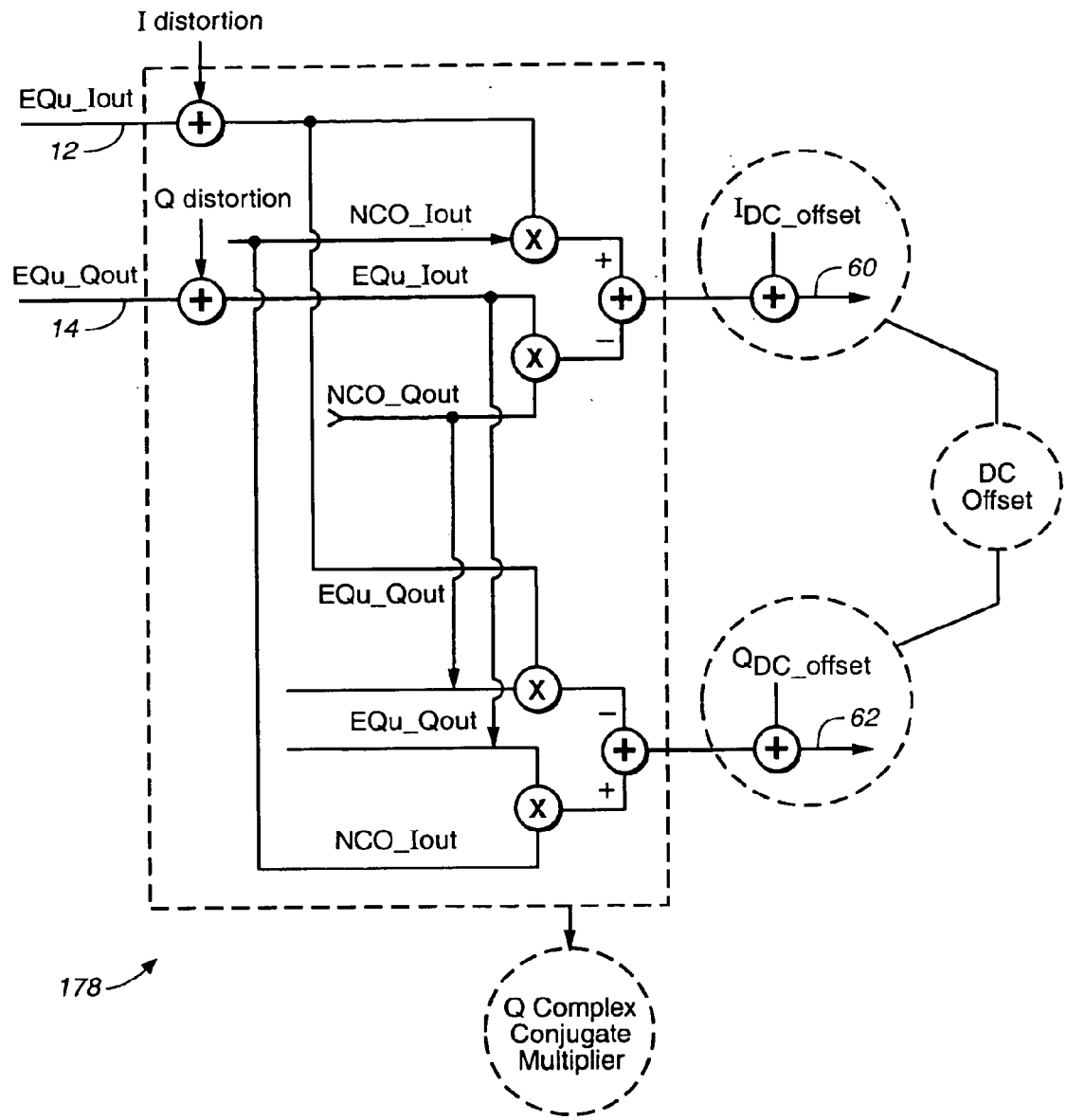
FIG._6A

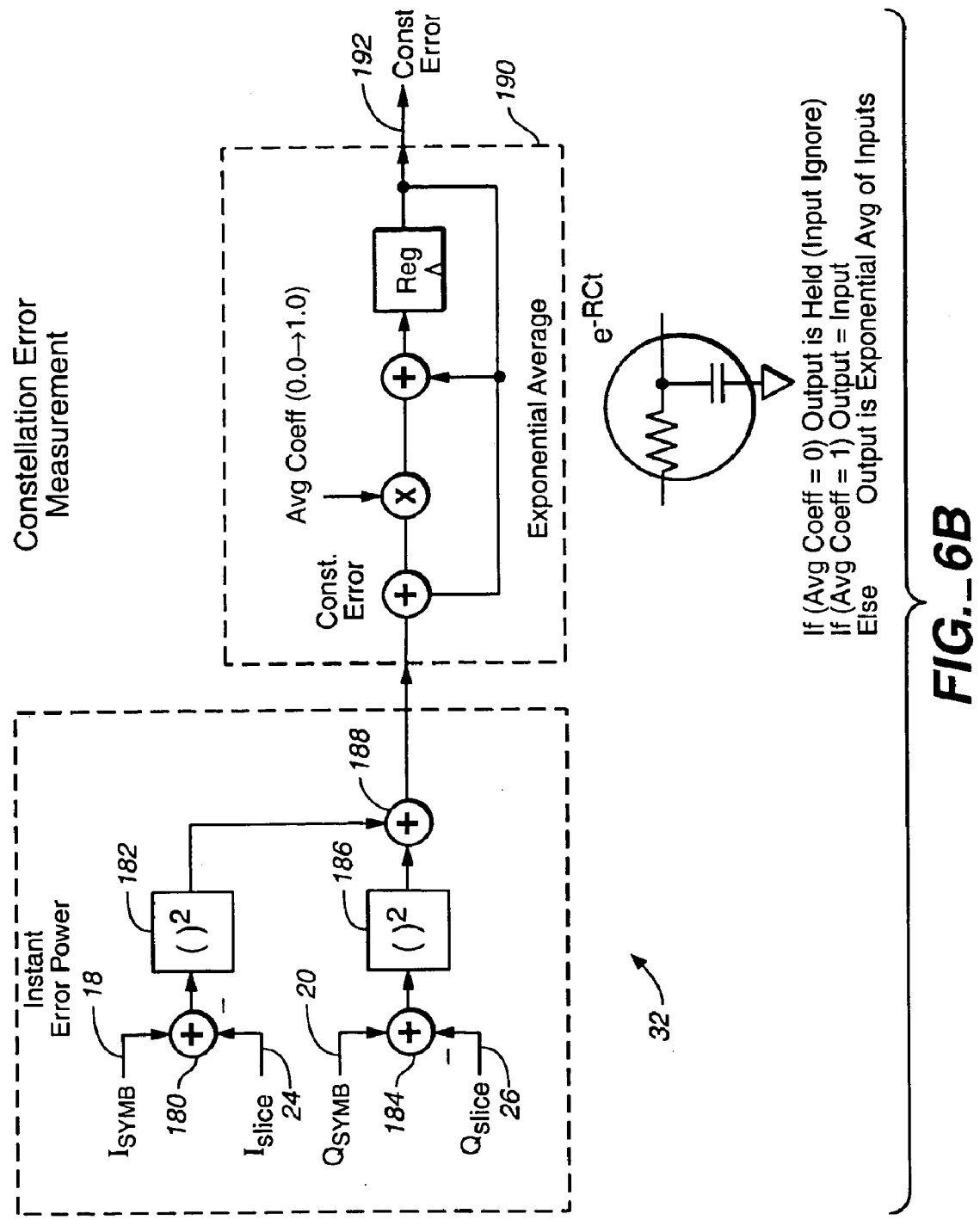
FIG._6B

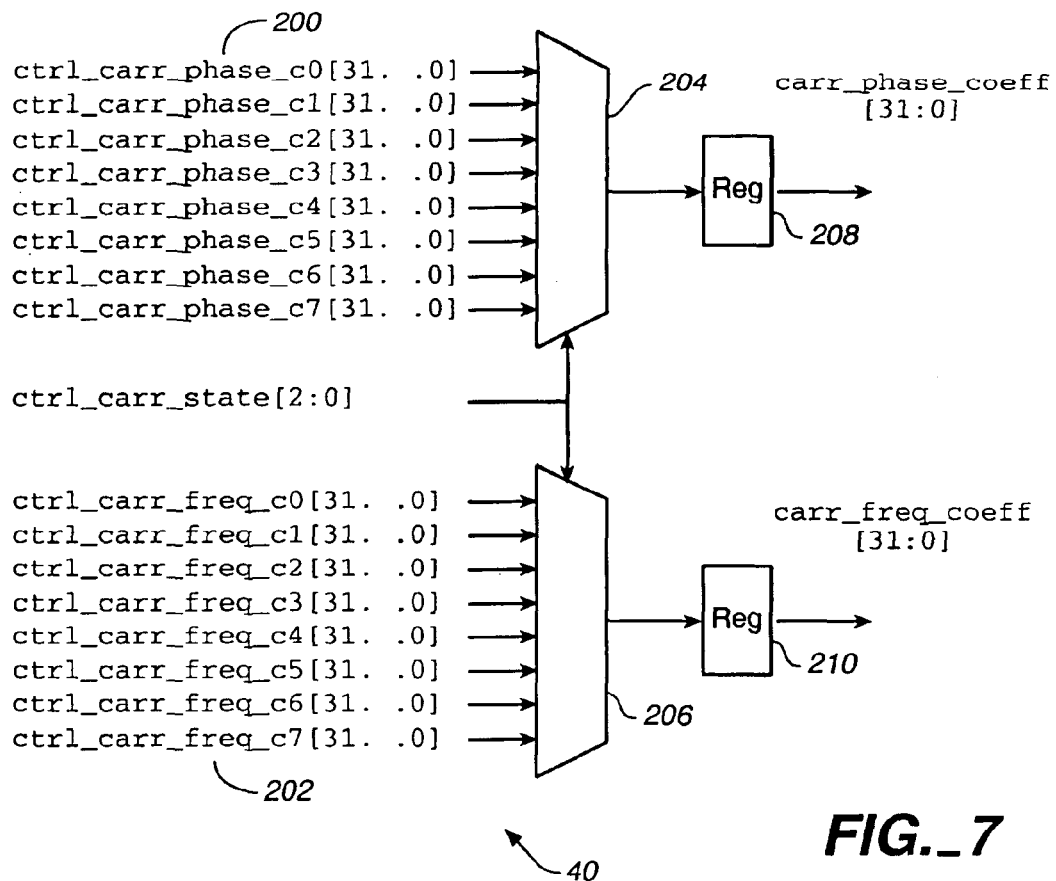
FIG._7
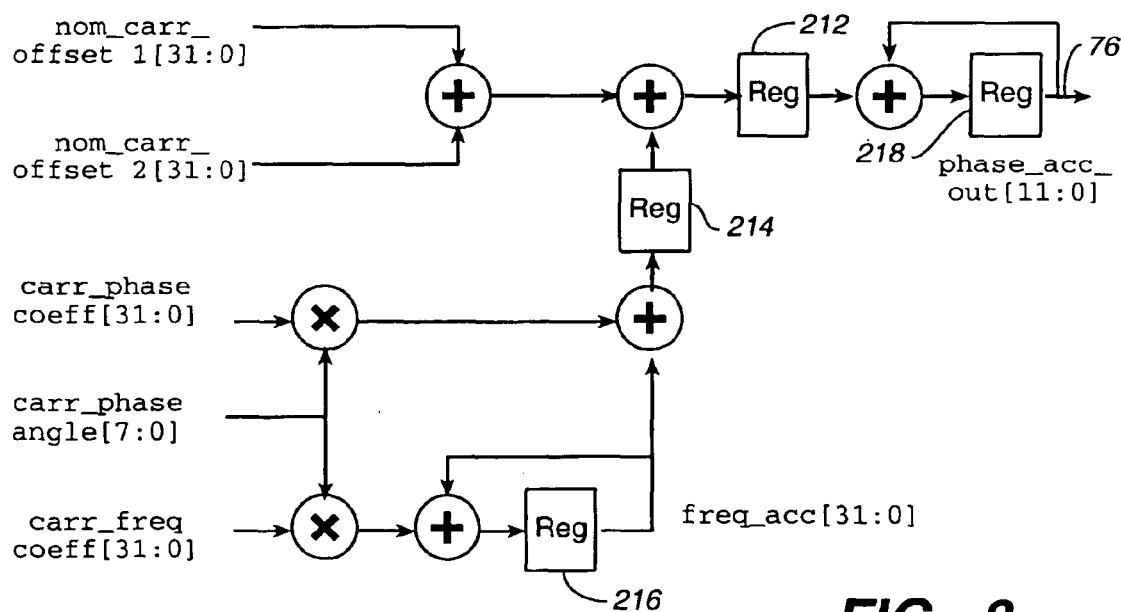
FIG._8

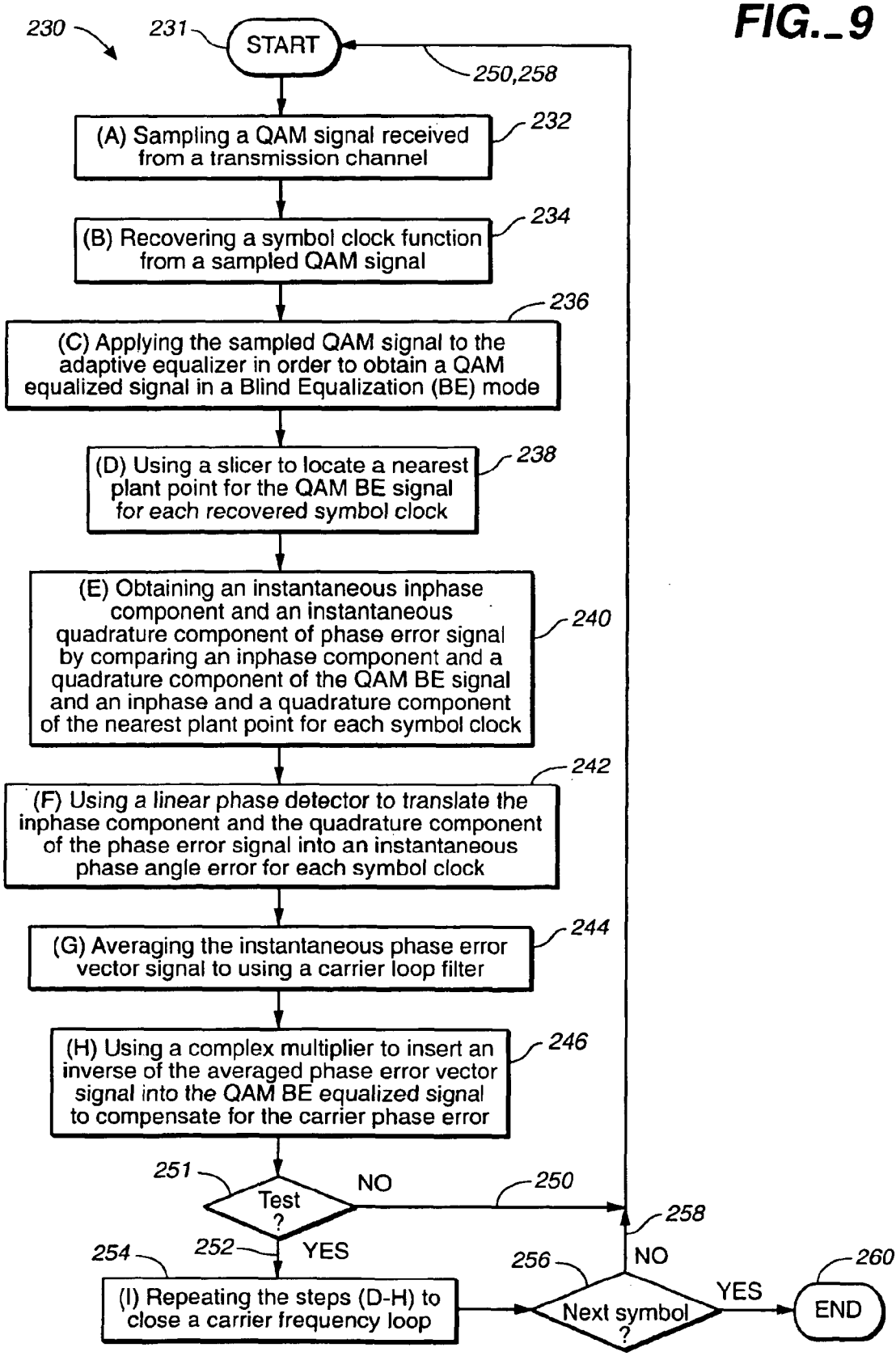
FIG._9

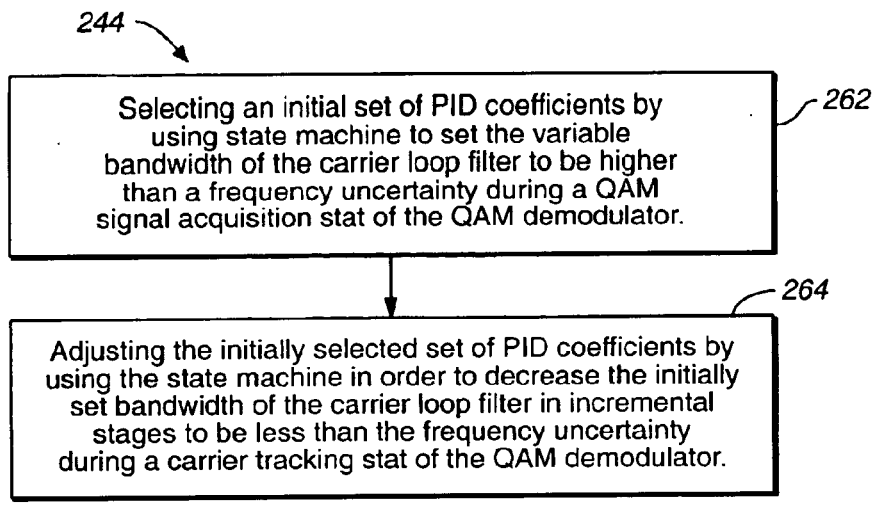
FIG._10
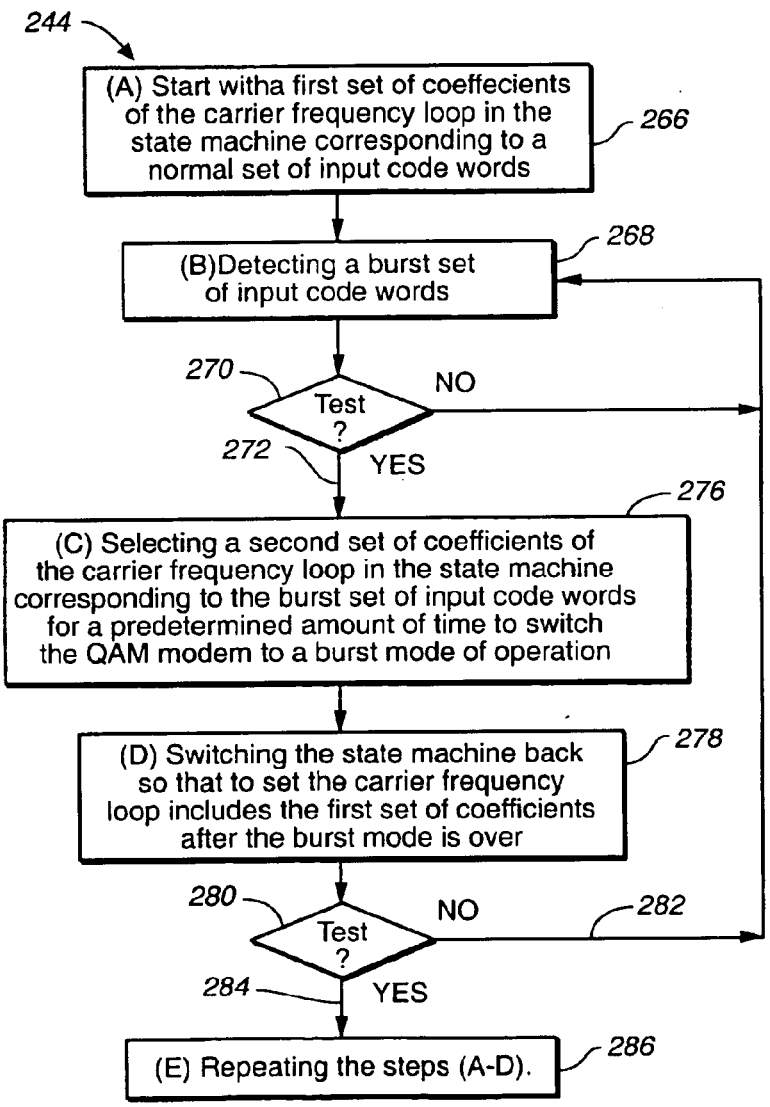
FIG._11

LINEAR PHASE ROBUST CARRIER RECOVERY FOR QAM MODEMS

BACKGROUND OF THE INVENTION

1. Field of the Invention

The present invention relates to the field of the digital signal processing, and more specifically, to the field of QAM modems.

2. Discussion of the Prior Art

Using the approach developed by Dominique N. Godard, "Self-Recovering Equalization and Carrier Tracking in Two-Dimensional Data Communication Systems", IEEE Transaction on Communications, Vol. Com-28, No. 11, November 1980, the general problem of adaptive channel equalization can be solved without resorting to a known training sequence or to conditions of limited distortion. The criterion of equalizer adaptation is the minimization of a new class of nonconvex cost functions which are shown to characterize intersymbol interference independently of carrier phase and of the data symbol constellation used in the transmission system prior to decision directed equalization (DDE).

Thus, in the approach developed by Dominique N. Godard (Godard approach), the equalizer convergence does not require carrier recovery, so that carrier tracking can be carried out at the equalizer output in a decision-directed mode. On the other hand, in the conventional approach, the carrier tracking is done first, and the equalization is done only after the carrier tracking is achieved. Accordingly, the carrier recovery loop used in the Godard approach has latency that is lower than latency of the carrier loop used in the conventional approach. However, in a carrier loop with any low latency, one should know the direction of the error signal in order to utilize the latency properties of the carrier loop to the full extend thus minimizing the time needed for carrier tracking.

To calculate the direction of the error signal one needs to use a slicer in order to locate a plant point (corresponding to the sent signal) that is nearest to the received signal. This is a "hard decision" approach. On another hand, one can use a Viterbi decoder without using a slicer to determine the direction of the error signal. This is a soft decision approach that requires a carrier loop with even more latency than the latency of a carrier loop in the "hard decision" approach.

Even for a very good oscillator that has 1 GHz basic frequency with the maximum frequency uncertainty (or frequency offset) of up to one part per billion, the carrier tracking would result in the QAM constellation rotating at frequency of 1 Hz. However, for purposes of measurement the direction of the error signal, the constellation should be stopped completely, or stabilized. It means that the carrier tracking should be achieved with 100% accuracy in order to calculate the direction of the error signal.

To stop the rotation of the QAM constellation completely, one should design a 2-nd order carrier phase loop with the bandwidth (BW) greater than a frequency offset. Practically, in a standard commercial transmission system (like an intersystem telephone) the typical user utilizes a small antenna with a 40 GHz crystal as a source of oscillating frequency that has an uncertainly of 10 part/per million. This translates into the frequency uncertainty of $(40 \times 10^9 \times 10^{-5}) = 4 \times 10^4 = 400$ kHz. Thus, one has to build a carrier loop filter with bandwidth (BW) greater than 400 kHz which requires a low latency. However, it is difficult to implement a high-rate, a low latency, and a high BW tracking loop.

Indeed, for the input signal including the symbol rate of 40 Mbits/sec=$4 \times 10^7$ symbols/sec, the ideal carrier tracking loop with a minimum latency would have no update within one clock time period. One clock period for the incoming symbol rate of 40 Mbits/sec=$4 \times 10^7$ symbols/sec is equal to $1/(40 \text{ Mbit})=(1/40) \times 10^{-6}$ sec=25 nanoseconds. In a practical implementation, one would need a pipeline computation (because the whole computation might take a lot of system clocks) and would save the intermediate results at registers. However, the pipeline computation degrades the performance of the loop by reducing the loop filter's BW. Indeed, the frequency uncertainly of the carrier tracking loop for the pipeline computation is equal to the loop filter BW divided by the incoming symbol rate. In the given above example, the frequency uncertainly of the carrier tracking loop for the pipeline computation is equal to 400 kHz/$4 \times 10^7$ symbols/sec=0.01=1%. This is a huge frequency uncertainty for one clock of pipeline computation, that only increases (though only linearly) with the number of clocks that a pipeline computation takes to perform.

What is needed is a low latency carrier tracking loop that has a large BW, as compared with the conventional large latency pipeline computation approach.

SUMMARY OF THE INVENTION

To address the shortcomings of the available art, the present invention provides a method and apparatus for a low latency carrier tracking loop that includes a relatively large loop bandwidth (BW) as compared with the prior art.

One aspect of the present invention is directed to a method of carrier tracking in a QAM demodulator including an adaptive equalizer. In one embodiment, the method of the present invention comprises the following steps: (A) sampling a QAM signal received from a transmission channel; (B) recovering a symbol clock function from the sampled QAM signal; (C) applying the sampled QAM signal to the adaptive equalizer in order to obtain a QAM equalized signal in a Blind Equalization (BE) mode; (D) using a slicer to locate a nearest plant point for the QAM Blind equalized signal for each recovered symbol clock; (E) using a phase detector to obtain an instantaneous inphase component and an instantaneous quadrature component of a phase angle error signal by comparing an inphase component and a quadrature component of the QAM Blind equalized signal and an inphase and a quadrature component of the nearest plant point for each symbol clock; (F) using a complex conjugate multiplier and a linear phase estimator to translate the inphase component and the quadrature component of the phase angle error signal into an instantaneous phase angle error for each symbol clock; (G) averaging the instantaneous phase angle error signal by using a carrier loop filter; and (H) using a complex multiplier to insert an inverse of the averaged phase angle error signal into the QAM Blind equalized signal to compensate for the carrier phase angle error. Steps (D–H are preferably repeated to close a carrier frequency loop including the complex multiplier, the slicer, the phase detector including the complex conjugate multiplier, the linear phase estimator, and the carrier loop filter. The QAM input signal includes the input carrier frequency within an acquisition bandwidth of the carrier frequency loop.

In one embodiment, the step (B) of recovering the symbol clock function from the sampled QAM signal further includes the step of determining for each sample an optimum sampling point located in the center of the current sampled QAM signal. In an alternative embodiment, the step (B) of recovering the symbol clock function from the sampled QAM signal further includes the step of interpolating between at least two preceding sampled QAM signals.

In one embodiment, the instantaneous phase angle error for each symbol clock is obtained in a Decision Directed Equalization (DDE) mode. In another embodiment, the instantaneous phase angle error for each symbol clock is obtained in a Blind Equalization (BE) mode.

In one embodiment of the present invention, the carrier frequency loop further includes a 1-st order Phase (P) carrier frequency loop, and the step (G) of averaging the phase angle error by using the P-carrier loop filter further includes the step of determining a set of (P)-phase coefficients for the carrier loop filter by using a state machine depending on clock counts, a measured average constellation error, and at least one error threshold. In another embodiment of the present invention, the carrier frequency loop further includes a 2-nd order Phase-Integration (PI) carrier frequency loop, and the step (G) of averaging the phase angle error by using the carrier loop filter further includes the step of determining a set of (P)-phase and (I)-integration coefficients for the 2-nd order Phase-Integration (PI) carrier frequency loop by using a state machine depending on clock counts, a measured average constellation error, and at least one error threshold. Yet, in one more embodiment of the present invention, the carrier frequency loop further includes a 3-d order Phase-Integration-Derivative (PID) carrier frequency loop, and the step (G) of averaging the phase angle error by using the carrier loop filter further includes the step of determining a set of (P)-phase, (I)-integration, and (D)-derivative coefficients for the 3-d order Phase-Integration-Derivative (PID) carrier frequency loop by using a state machine depending on clock counts, a measured average constellation error, and at least one error threshold.

In one embodiment of the present invention, the step (G) of estimating the instantaneous phase angle error further includes the step of using a quasi-linear phase detector to approximate the phase angle error signal as a multi-bit function. In another embodiment of the present invention, the step (G) of estimating the instantaneous phase angle error further includes the step of using a quasi-linear phase detector to approximate the phase angle error signal as a multi-bit $\tan^{-1}$ function.

Another aspect of the present invention is directed to an apparatus for robust carrier recovery in a QAM demodulator. In one embodiment, the apparatus comprises: (a) a sampling block configured to sample QAM signal received from a transmission channel; (b) a symbol clock recovery block configured to recover a symbol clock function from the sampled QAM signal; (c) an adaptive equalizer configured to transform the sampled QAM signal into a QAM equalized signal in a Blind Equalization (BE) mode; (d) a slicer configured to locate a nearest plant point for the QAM Blind equalized signal for each recovered symbol clock; (e) a complex multiplier configured to obtain an instantaneous inphase component and an instantaneous quadrature component of a phase angle error signal by comparing an inphase component and a quadrature component of the QAM Blind equalized signal and an inphase and a quadrature component of the nearest plant point for each symbol clock; (f) a linear phase estimator configured to translate the inphase component and the quadrature component of the phase angle error signal into an instantaneous phase angle error for each symbol clock; (g) a carrier loop filter configured to average the instantaneous phase angle error signal; and (h) a complex multiplier configured to insert an inverse of the averaged phase angle error signal into the QAM Blind equalized signal to compensate for the carrier phase angle error.

BRIEF DESCRIPTION OF DRAWINGS

The aforementioned advantages of the present invention as well as additional advantages thereof will be more clearly understood hereinafter as a result of a detailed description of a preferred embodiment of the invention when taken in conjunction with the following drawings.

FIG. 1 depicts a block diagram of the apparatus of the present invention for linear phase robust carrier recovery for a QAM modem.

FIG. 2 illustrates a real 16-QAM constellation affected by noise, distortions, and other sources of impairments.

FIG. 3 shows the complex multiplier and the slicer of FIG. 1 in more details.

FIG. 4 depicts the phase detector of FIG. 1 in more details.

FIG. 5A shows response functions for the phase detector approximated as a one-bit function quasi-linear phase detector, as a multi-bit function quasi-linear phase detector, and as a multi-bit $\tan^{-1} \theta$ function quasi-linear phase detector.

FIG. 5B illustrates that the normalized I component of the phase angle error signal is always positive and larger than the normalized Q component of the phase angle error signal for any constellation.

FIG. 5C depicts a total loop latency of the carrier tracking loop.

FIG. 6A illustrates a block diagram designed to calculate the DC offset.

FIG. 6B depicts a constellation error measurement block of FIG. 1 in more details.

FIG. 7 shows the state machine for the 2-nd order PID carrier tracking loop including a first bank of PI coefficients, and a second bank of PI-coefficients.

FIG. 8 illustrates the implementation of a carrier loop filter of FIG. 1 configured to average the instantaneous phase angle error signal and to output the averaged phase angle error signal that is used by the NCO block to calculate the derotation phase angle.

FIG. 9 is a flow chart of a method of the present invention including the carrier tracking in a QAM demodulator with a linear phase robust carrier recovery.

FIG. 10 shows the flow chart of the averaging step of flow chart of FIG. 9 in more details when the QAM modem operates under normal conditions.

FIG. 11 illustrates the flow chart of the averaging step of flow chart of FIG. 9 in more details when the QAM modem operates in the burst mode.

DETAILED DESCRIPTION OF THE PREFERRED AND ALTERNATIVE EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

FIG. 1 depicts a block diagram 10 of the apparatus of the present invention for linear phase robust carrier recovery for a QAM modem in the demodulator side of the transmission channel. The RF demodulator (not shown) mixes the received signal down to the IF for the I-Q demodulator 10 of FIG. 1). The recovered IF spectrum (not shown) is similar to the transmitted one, but with the additive noise floor (not shown). The I-Q demodulation takes place in the reverse order to the I-Q modulation process. The signal is split into two paths, with each path being mixed down with IF's that are 90 degrees apart. The recovered I component should be near identical to that transmitted, with the only difference being caused by noise.

Once the analog I and Q components have been recovered, they should be digitized. This is done by the bit detector in the DEMAP block (not shown). The bit detector determines the most likely bit (MLB) transmitted by sampling the I and Q signals at the correct sampling instants and compares them to the legitimate I and Q values of −3d, −d, d, 3d in the case of a square QAM constellation. From each I and Q decision two bits are derived, leading to a 4-bit 16-QAM symbol. The four recovered bits are then passed to the D/A converter (not shown). If the channel's SNR is high enough, the reconstructed digital signal is identical to the original input signal. Provided the D/A converter operates at the same frequency and with the same number of bits as the input A/D converter, then the analog output signal after lowpass filtering with a cut-off frequency of B in block LPF (not shown), is a close replica of the input signal.

Referring still to FIG. 1, a symbol clock recovery block 13 is configured to recover a symbol clock function from the sampled QAM signal. The right time to sample is a function of the clock frequency and phase at the transmitter. The symbol clock should be recovered. Please, see the U.S. Pat. No. 6,278,741 issued to Danzer et al., entitled "Timing Recovery Circuit in QAM Modems", and assigned to the assignee of the present patent application.

Any error in the clock recovery will increase the bit error rate (BER). Both clock and carrier recovery systems attempt to derive information about timing from the received signal. While carrier recovery is only necessary in a coherent demodulation system, clock recovery is required in all schemes, and accurate clock recovery is essential for reliable data transmission. Clock recovery attempts to synchronize the receiver clock with the baseband symbol rate transmitter clock, wherein carrier recovery endeavors to align the receiver local oscillator with the transmitted carrier frequency.

The basic assumptions made by the early-late method are that the peaks in the incoming waveform are at the correct sampling points and that these peaks are symmetrical. The early-late (EL) scheme (not shown) firstly squares the incoming signal in order to render all peaks positive, and then takes two samples of the received waveform, both equi-spaced around the predicted sampling point. If the predicted sampling instant is aligned with the correct sample point, and the assumptions made above are correct, then the sample taken just prior to the sample point—the early sample—will be identical to the sample taken just after the sampling instant—the late sample. If the early sample is larger than the late sample, this indicates that the recovered clock is sampling too late, and if the early sample is smaller than the late sample this indicates that the recovered clock is sampling too early. The difference of each pair of samples is low-passed in the LPF block (not shown) to reduce the effect of random noise on the system. This filtered difference signal adjusts the frequency of a voltage controlled oscillator VCO (not shown) in order to delay or advance the arrival of the next clock impulse, as required by the early and late samples. The early-late (EL) clock recovery works well in conjunction with binary modulation schemes which have peaks in most of the symbol periods, but less satisfactory with multilevel schemes because there are fewer distinctive peaks. Indeed, the major problem with EL clock recovery for QAM transmissions is that not all QAM sequences result in time-domain waveform peaks occurring every sampling period. An even more detrimental effect is that half the peaks are of the wrong polarity for the clock recovery technique. The consequence is that the E-L difference signal, which should be negative for all the is correct for only a fraction of the transmitted symbols. These problems render the conventional EL clock recovery system for QAM unreliable.

In the preferred embodiment of the present invention, the symbol clock recovery block 13 (of FIG. 1) uses the timing recovery circuit disclosed in '741 patent that is incorporated in the present patent application in its entirety. The basic steps of the method of the '741 patent are as follows. After sampling the QAM baseband signal, a symbol timing recovery logic is utilized to develop a local error signal. The local error signal is averaged over a predetermined time period and is used to make a global decision regarding the sampling point position relative to the baseband signal maximum/minimum. Based on the global decision, a correction command is issued to the analog front end to either advance or delay the sample timing. The essence of the method of the symbol timing recovery of the '741 patent is a symbol timing recovery algorithm which includes the following steps. After estimating an absolute value of the first derivative of the QAM baseband signal separately for the real and imaginary axis, the estimated absolute values of the real and the imaginary first derivatives of the QAM baseband signal are added to develop a resulting signal. The resulting signal is multiplied by a weighting function to develop the local error signal.

The real transmission channel is not distortion-free, and therefore even if the Nyquist criterion is met the intersymbol interference (ISI) is still introduced. If we assume that the transmission media introduces linear distortions, the aim of channel equalization is to remove the distortions introduced by the propagation channel. This task can be carried out either in frequency domain by filtering the received signal through the inverse filter of the channel, or in the time domain by convolving it with the appropriate equalizer impulse response. Linear distortions are introduced, for example, in the wideband radio channels when there is a plurality of radio paths between the transmitter and receiver, and the delay on some of these paths is significantly greater than on others. This is a so called multipath fading case. The only areas where significant multipath fading has been encountered are on high transmission rate (typically greater than 140 Mbits/s) point-to-point radio links. The typical prior art equalizer used to fight those distortions is a linear, or a decision-directed feedback adaptive equalizer.

Referring still to FIG. 1, a decision-directed feedback adaptive equalizer 11 used in the present invention is configured to transform the sampled QAM signal into inphase (I) 12 and quadrature (Q) 14 components of the QAM equalized signal in a Blind Equalization (BE) mode (please, see discussion below). As we follow the Godard approach, no training data symbol sequence is needed and the equalization process and the carrier tracking recovery can be done independently from each other.

FIG. 2 depicts a real 16-QAM constellation 100 affected by noise, distortions, and other sources of impairments. A real 16-QAM symbol has a plant point 104, and belongs to an error circle 102, if real 16-QAM constellation 100 is affected only by noise, because noise is substantially the same for each symbol. However, the constellations points (116, 114) that are further away from the origin than the constellations points (112, 120) have the largest power, that is the signal-to-noise (SNR) ratio is the biggest one for the points belonging to the largest circle 124, as compared to the SNR for the symbols belonging to the smallest circle 126.

If in addition to noise, the QAM constellation is affected by a distortion, the circles shift from their symmetrical positions around plant points. If the distortion is perfectly compensated, the circle shifts back to its unshifted position (for instance, circle 113 is shifted back to its unshifted position 112). If the compensation is insufficient, or poor, the circle remains shifted as opposed to its unshifted position (for instance, circle 109 remains shifted after poor compensation as compared to its unshifted position 108). By measuring the inphase ($\Delta I$) and quadrature ($\Delta Q$) components of the deviation from the shifted plant point position to unshifted plant point for each constellation QAM point, one can determine the error signal.

In one embodiment of the present invention, a plurality of inphase ($\Delta I$) and quadrature ($\Delta Q$) error components for each plant point of a QAM symbol is averaged in order to determine the average error compensation signal. In this embodiment, which is called a directed decision equalization (DDE) mode, the error compensation signal can be calculated as follows:

$$\text{DDE distortion compensation signal} = <W(\text{symbol}) \Sigma_{All\ Symbols} \{ [\text{Symbol}_I - \text{Plant}_I]^2 + [\text{Symbol}_Q - \text{Plant}_Q]^2 \}>; \quad (1)$$

wherein W(symbol) is a weighting function depending on a symbol.

In one embodiment, the weighting function W(symbol) is chosen in such a way that all symbols are taken into account in order to generate a distortion compensation signal. In this embodiment, the weighting function is as follows:

$$W(\text{symbol})=1;\ \text{for each symbol}. \quad (2)$$

However, it is also important to know whether the symbol that belongs to the circle 124 is less than or greater than the dispersion value according to Godard approach. To take care of this problem, one should calculate the Blind Mode Error compensation signal for each outside symbol as follows:

$$\text{Blind Mode Error distortion compensation signal}_{Each\ Symbol} = \{ [\text{Symbol}_I + \text{Symbol}_Q]^2 - [\text{Power}_{Dispersion\ value}] \}. \quad (3)$$

Referring still to FIG. 1, the inphase (I) 18 and the quadrature (Q) 20 components of the equalized signal are further processed by the carrier frequency loop comprising a slicer 22, a complex conjugate multiplier 30, a phase detector 28, a carrier loop filter 74, and a complex multiplier 16. A bandwidth of the carrier frequency loop is a variable one (see discussion below). However, in the preferred embodiment of the present invention, the QAM input signal includes an input carrier frequency within the acquisition bandwidth of the carrier frequency loop.

Referring still to FIG. 1, the QAM Blind equalized signal including I component 18 and Q component 20 and having a carrier offset is derotated by a complex multiplier 16 with the output of the carrier loop filter 74 and numerically controlled oscillator (NCO) 80 thus closing the carrier tracking loop (see discussion below). The detailed circuitry of the complex multiplier 16 is shown in FIG. 3.

The slicer 22 of FIG. 1 (also shown in more details in FIG. 3) is configured to locate a nearest plant point for the QAM Blind equalized signal for each recovered symbol clock. Thus, the inphase slicer output 24 and the quadrature slicer output 26 are I and Q components (correspondingly) of a plant point that is nearest to the actual symbol.

A complex conjugate multiplier 30 (of FIG. 1) is coupled to the slicer 22 and is configured to obtain an instantaneous inphase component and an instantaneous quadrature component of a phase angle error signal by comparing the inphase 18 component and the quadrature component 20 of the QAM Blind equalized signal and the inphase 24 and the quadrature component 26 of the nearest plant point for each symbol clock.

The phase detector 28 of FIG. 1 is shown in more details in FIG. 4. The phase detector 28 is configured to translate the inphase component and the quadrature component of the phase angle error signal into an instantaneous phase angle error 54 for each symbol clock. In one embodiment, the phase detector 28 further includes an algorithm configured to obtain an instantaneous phase angle error 54 for each symbol clock in a Decision Directed Equalization (DDE) mode. In another embodiment, the phase detector 28 further includes an algorithm configured to obtain an instantaneous phase angle error 54 for each symbol clock in a Blind Equalization (BE) mode.

The instantaneous phase angle error 54 is further converted to a linear phase angle error value for each symbol clock and is used as an input signal to the carrier loop filter 74. In one embodiment, as depicted in FIG. 5A, the phase detector 28 further includes a one-bit quasi-linear phase detector including a response function 142. In this embodiment, the phase detector 28 is configured to approximate the phase angle error signal as a one-bit directional error step function. In another embodiment, the phase detector 28 further includes a multi-bit quasi-linear phase detector including a response function 144 as depicted in FIG. 5A. In this embodiment, the phase detector 28 is configured to approximate the phase angle error signal as a multi-bit directional error step function.

Yet, in one more embodiment, the phase detector 28 further includes a multi-bit $\tan^{-1} \theta$ function quasi-linear phase detector including a response function 146 as depicted in FIG. 5A. In this embodiment, the phase detector 28 is configured to approximate the phase angle error signal as a multi-bit $\tan^{-1} \theta$ function.

The next step is to compute the phase angle error angle $\theta$ by the use of an arctangent approximation. The developed approximation works as follows. It is well known property of the $\tan^{-1}$ function, that for small error signals $\theta < 1$:

$$\tan^{-1}\theta \approx \theta. \quad (4)$$

It can be shown that the normalized I component of the phase angle error signal is always positive and larger than the normalized Q component of the phase angle error signal for any constellation. Indeed, as illustrated in FIG. 5B, for:

$$(-)45° \leq \theta_{error} \leq 45° \quad (5)$$

$$\tan \theta_{error} \approx (Q_{error})/(I_{error}) = (I_{plant}Q_{symbol} - Q_{plant}I_{symbol})/(I_{plant}I_{symbol} + Q_{plant}Q_{symbol}) \quad (6)$$

But, for the plant point $\theta_{plant}=45°$, $\tan(\theta_{plant}=45°)=1 \ll I_{plant}=Q_{plant}$. It follows that:

$$\tan\theta_{error} \approx (Q_{error})/(I_{error}) = (Q_{symbol}-I_{symbol})/(I_{symbol}+Q_{symbol}) \quad (7)$$

For small error signals $\theta<1$:

$$\tan\theta \approx \theta \quad (8)$$

Therefore, for small error signals $\theta<1$:

$$\theta_{error}=\tan^{-1}\theta=\tan((Q_{error})/(I_{error}))=(Q_{error})/(I_{error})=(Q_{error})\times(I_{error})^{-1}. \quad (9)$$

Thus, in this embodiment, the multi-bit $\tan^{-1}\theta_{error}$ function quasi-linear phase detector configured to approximate the phase angle error signal $\theta_{error}$ as the multi-bit $\tan^{-1}\theta_{error}$ function includes an algorithm according to Eq. (9) that comprises the following steps:

(A) normalizing I and Q components of the phase angle error signal;

(B) reciprocating (inversing) the normalized I component of the phase angle error signal;

(C) multiplying the normalized Q component of the phase angle error signal and inversed normalized I component of the phase angle error signal; and (D) approximating the multi-bit $\tan^{-1}$ function by the normalized Q component of the phase angle error signal multiplied by the inversed normalized I component of the phase angle error signal. (10)

In one embodiment, the algorithm (10) can be implemented using a lookup table. The I component of the error signal is normalized into a binary mantissa and exponent. The most significant N bits of the mantissa are used as an index into a table to compute the inverse of I times a phase detector 28 gain. Since the normalization forces the mantissa to be between a value of 1 and 2, the resulting inverse lookup table is a quite small one and is accurate up to N=10. According to Eq. (8), for small error signals $\theta \ll 1 \ll \tan\theta=\theta$. Thus, the final step of the algorithm (10) can be implemented by multiplying the output of the inverse lookup table by the Q value normalized by the same amount as I value. The maximum possible phase angle error for QPSK is $\pi/4$. Even for $\pi/4$ the error between the approximation and the actual arctangent is only 22%. For $\pi/6$ (30°) the error between the approximation and the actual arctangent is only 9%. For $\pi/12$ (15°) the error is only 2%. A phase of zero is represented by zero. A phase angle error of $(+\pi/4)$ is represented by $(+511)$. A phase angle error of $(-\pi/4)$ is represented by $(-512)$. This is equivalent to a 10-bit 2's complement representation.

In one embodiment of the present invention, the carrier frequency loop further includes a 1-st order Phase (P) carrier frequency loop. In this embodiment, the state machine 42 is configured to pre-compute a set of (P)-phase coefficients 44 for the carrier loop filter by utilizing a set of clock counts 36, a measured average constellation error 34 (see discussion below), and at least one error threshold initial setup 38.

In another embodiment of the present invention, the carrier frequency loop further includes a 2-nd order Phase-Integration (PI) carrier frequency loop. In this embodiment, the state machine 42 is configured to pre-compute a set of (P)-phase 44 and (I)-integration 46 coefficients for the 2-nd order Phase-Integration (PI) carrier frequency loop by utilizing a set of clock counts 36, the measured average constellation error 34, and at least one error threshold initial setup 38.

Yet, in one more embodiment of the present invention, the carrier frequency loop further includes a 3-d order Phase-Integration-Derivative (PID) carrier frequency loop. In this embodiment, the state machine 42 is configured to pre-compute a set of (P)-phase 44, (I)-integration 46, and (D)-derivative 48 coefficients for the 3-d order Phase-Integration-Derivative (PID) carrier loop by utilizing a set of clock counts 36, the measured average constellation error 34, and at least two error thresholds initial setup 38.

FIG. 5C depicts a total loop latency of the carrier tracking loop 172. According to FIG. 5C, Carrier & Derotate Slicer 177 includes N1 symbol clocks for pipeline clock latency. In one embodiment, when QAM is fully implemented as a software algorithm, N1=0, which means that the carrier loop operates with latency equal to zero. In the hardware implementation, as symbol rates increase, pipelining becomes necessary to reduce hardware complexity. Thus, one can trade off the decrease in the complexity of hardware by increasing the latency of the carrier loop. Typical N1 for ASIC hardware implementation is N1=symbol clock.

Referring still to FIG. 5C, in the hardware implementation the carrier recovery block 173 includes N2 symbol clocks for pipeline clock latency, the carrier coeff. mux 174 includes N3 symbol clocks for pipeline clock latency, the carrier loop filter 175 includes N4 symbol clocks for pipeline clock latency, and the NCO 176 includes N5 symbol clocks for pipeline clock latency. In one hardware implementation embodiment, $$N1+N2+N3+N4+N5=8 \text{ symbol clocks.} \quad (11)$$

Referring still to FIG. 1, an inphase (1) 60 and a quadrature (Q) 62 components of the DC offset are introduced into the phase detector 28 to make sure that the symbol point is compared with the right plant point when DC offsets are in the input signal. In one embodiment, FIG. 6A depicts the block diagram 178 designed to calculate the DC offset.

FIG. 6B depicts a constellation error measurement block 32 (of FIG. 1) in more details. The constellation error measurement block 32 (of FIG. 1) always operates in a directed decision equalization (DDE) mode. The constellation error measurement block 32 takes the I 18 and Q 20 components of each symbol (after the derotation) and the I 24 and Q 26 components of the plant point determined by the slicer 22 (corresponding to that symbol) and calculates a plurality of inphase ($\Delta I$) and quadrature ($\Delta Q$) distortion components for each plant point of a QAM symbol. The block 182 performs the operation:

$$[Symbol_I-Plant_I]^2; \quad (12)$$

wherein the block 186 performs the operation $$[Symbol_Q-Plant_Q]^2. \quad (13)$$

The plurality of inphase ($\Delta I$) and quadrature ($\Delta Q$) distortion components is further averaged in order to determine the average distortion compensation signal. In one embodiment, the averaging operation is done by using the exponential averager 190 (of FIG. 6). The resulting constellation error signal calculated in DDE mode 34 is used by the states machine 42 (of FIG. 1) to automatically change states which determines the coefficients of the carrier tracking loop in both BE mode and in DDE mode.

In the preferred embodiment, as depicted in FIG. 7, the state machine 42 (of FIG. 1) for the 3-d order PID carrier tracking loop further includes a set of coefficients 40 including the set of two banks of PID coefficients: a first bank of PID coefficients 200, and a second bank of PID coefficients 202. The first bank of PID coefficients 200 is used to initially set a variable bandwidth of the carrier loop filter to be higher than a frequency uncertainty during a QAM signal acquisition state of the QAM demodulator. The second bank of PID coefficients is used to decrease the initially set bandwidth of the carrier loop filter in incremental stages to be less than the frequency uncertainty during a carrier tracking state of the QAM demodulator. It is well known in the art that a loop with a lower BW introduces the minimum phase noise into the device. Therefore, the usage of two set of PID coefficients depending on the state of the signal acquisition allows one to set an optimum BER in the carrier tracking loop by minimizing the loop BW for each phase of signal acquisition.

In the preferred embodiment, one selects the coefficients in the two banks of coefficients 200 and 202 in such a way as to start the signal acquisition process with a carrier tracking loop having a higher bandwidth (BW) to speed up the time that takes for loop to become a stable one. After the loop becomes a stable one, one should narrow the bandwidth (BW) in incremental stages by selecting appropriate coefficients in the banks of coefficients 200 and 202 to change the modem state.

In one embodiment, the state machine 42 includes the following averaging algorithm that determines at which point the bandwidth (BW) of the loop should be changed:
- monitoring an average QAM constellation phase angle error;
- obtaining an average amplitude error power of the QAM constellation; and
- switching the bandwidth to a lower value based on the average power of the constellation. (14)

In another embodiment, the state machine 42 includes an exponential averaging algorithm that determines at which point the bandwidth (BW) of the loop should be changed:
- monitoring an average QAM constellation phase angle error;
- performing an exponential averaging to get an average amplitude error power of the QAM constellation; and
- switching the bandwidth to a lower value based on the average power of the constellation. (15)

In an additional embodiment, for burst mode modems, the coefficients selection in the banks 200 and 202 (of FIG. 7) can be made for predetermined amount of time if one knows in advance the time period for preamble transmission (the carrier frequency acquisition) and the time period for data transmission (the carrier phase acquisition). The carrier frequency acquisition is accomplished by using the loop with a wider BW, and the loop's BW is later decreased during the carrier phase acquisition to minimize the phase noise.

In one embodiment, the state machine 42 (of FIG. 1) can be implemented using a application specific integrated circuit (ASIC). In an alternative embodiment, the state machine 42 (of FIG. 1) can be implemented using a general purpose programmable chip that is used as a special purpose state machine. Yet, in one more embodiment, a stand alone RAM (random access memory) can be used (instead of a set of registers) to implement the state machine 42 of FIG. 1.

In one embodiment of the present invention, FIG. 8 depicts the implementation of a carrier loop filter 74 (of FIG. 1). The carrier loop filter 74 is configured to average the instantaneous phase angle error signal and to output the averaged phase angle error signal 76 that is used by the NCO block 78 (of FIG. 1) to calculate the averaged derotation phase angle specified by complex NCO values. The complex multiplier 16 (of FIG. 1) is configured to insert an inverse of the calculate averaged phase angle error signal, or the averaged derotation phase angle, into the QAM Blind equalized signal to compensate for the carrier phase angle error. The output of the complex multiplied used for carrier removal (or derotation) is registered. This is implementation dependent, or optional, but at a very high symbol rate, it is generally necessary. Thus, the carrier tracking loop is closed.

After the carrier recovery is done in BE mode, and after the blind equalization is performed (Godard approach), the carrier tracking loop is switched to the DDE mode to compute the phase angle error signal. For the BE mode and for the DDE modes the thresholds are different, and therefore after switching from the BE mode to the DDE mode the equalizer coefficients (taps) are updated according to a DDE algorithm.

Another aspect of the present invention is directed to a method of carrier tracking in a QAM demodulator with a linear phase for robust carrier recovery. In one embodiment, the method of the present invention comprises the steps depicted in the flow chart 230 of FIG. 9. In one embodiment, the method performed by using the apparatus 10 of the present invention depicted in FIG. 1. comprises the following steps.

After (step 232) sampling of a QAM signal received from a transmission channel is performed, a symbol clock function from the sampled QAM signal is recovered (step 234), and the sampled QAM signal is applied to the adaptive equalizer 11 (of FIG. 1) in order to obtain a QAM equalized signal in a Blind Equalization (BE) mode (step 236). The slicer 22 (of FIG. 1) is used to locate a nearest plant point for the QAM Blind equalized signal for each recovered symbol clock (step 238), and the complex conjugate multiplier 30 (of FIG. 1) is utilized to obtain an instantaneous inphase component and an instantaneous quadrature component of a phase angle error signal by comparing an inphase component and a quadrature component of the QAM Blind equalized signal and an inphase and a quadrature component of the nearest plant point for each symbol clock (step 240). The linear phase detector 28 (of FIG. 1) is used (in the step 242) to translate the inphase component and the quadrature component of the phase angle error signal into an instantaneous phase angle error 54 for each symbol clock. The averaging of the instantaneous phase angle error signal is performed (step 244) by using a carrier loop filter 74. Finally, after the NCO calculates the derotation phase angle, a complex multiplier is used (step 246) to insert an inverse of the averaged phase angle error signal (the derotation phase angle) into the QAM Blind equalized signal to compensate for the carrier phase angle error. If the carrier frequency tracking of the received symbol is achieved, that is the test condition 251 is satisfied, the chart follows the logical arrow 252 and the steps (232–246) are preferably repeated to close the carrier frequency loop. If the prior symbol has not been yet tracked while the next symbol is received (if test 251 fails), the carrier loop is performing the pipeline carrier tracking, that is the steps (234–250) are repeated to achieve tracking of the preceding symbol whereas the next symbol has been already received.

In the preferred embodiment, the step (G) of averaging (step 244 of FIG. 9) further includes the step of setting a variable bandwidth of the carrier loop filter in order to minimize the carrier loop filter bandwidth and in order to optimize the bit error rate (BER).

In one embodiment, depicted in FIG. 10 as a flow chart 244, if the carrier frequency loop of FIG. 1 includes a 3-d order Phase-Integration-Derivative (PID) carrier frequency loop, the step of setting the variable bandwidth of the carrier loop filter further includes the following steps. In the step (262) an initial set of PID coefficients is selected by using the state machine (42 of FIG. 1) to set the variable bandwidth of the carrier loop filter to be higher than a frequency uncertainty during a QAM signal acquisition state of the QAM demodulator. In the step (264) the initially selected set of PID coefficients is adjusted by using the state machine (42 of FIG. 1) in order to decrease the initially set bandwidth of the carrier loop filter in incremental stages to be less than the frequency uncertainty during a carrier tracking state of the QAM demodulator.

In one additional embodiment, (shown in FIG. 11), when the QAM modem operates in the burst mode, the step (G) (step 244 of FIG. 9) of setting the variable bandwidth of the carrier loop filter includes the following steps. At the step (266) a first set of coefficients of the carrier frequency loop in the state machine corresponding to a normal set of input code words is selected. If a burst set of input code words is detected (step 268), the flow chart follows the logical arrow 272 and a second set of coefficients of the carrier frequency loop in the state machine corresponding to the burst set of input code words is selected for a predetermined amount of time to switch the QAM modem to the burst mode of operation. When the burst mode is over (test condition 280 is satisfied), the state machine 42 (of FIG. 1) is switched back so that the carrier frequency loop again includes the first set of coefficients (step 286). The steps (266–286) are preferably repeated for each next burst of input symbols.

The foregoing description of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. In a QAM demodulator including an adaptive equalizer, a method of carrier tracking comprising the steps of:

(A) sampling a QAM signal received from a transmission channel;

(B) recovering a symbol clock function from said sampled QAM signal;

(C) applying said sampled QAM signal to said adaptive equalizer in order to obtain a QAM equalized signal in a Blind Equalization (BE) mode;

(D) using a slicer to locate a nearest plant point for said QAM Blind equalized signal for each said recovered symbol clock;

(E) using a complex conjugate multiplier to obtain an instantaneous inphase component and an instantaneous quadrature component of a phase angle error signal by comparing an inphase component and a quadrature component of said QAM Blind equalized signal and an inphase and a quadrature component of said nearest plant point for each said symbol clock;

(F) using a phase detector to translate said inphase component and said quadrature component of said phase angle error signal into an instantaneous phase angle error for each said symbol clock;

(G) averaging said instantaneous phase angle error signal by using a carrier loop filter;

(H) using a complex multiplier to insert an inverse of said averaged phase angle error signal into said QAM Blind equalized signal to compensate for said carrier phase angle error; and (I) repeating said steps (D–H) to close a carrier frequency loop, wherein said carrier frequency loop includes said complex multiplier, said slicer, said phase detector including said complex conjugate multiplier, and said carrier loop filter, and wherein said QAM input signal includes said input carrier frequency within an acquisition bandwidth of said carrier frequency loop.

2. The method of claim 1, wherein said step (B) of recovering said symbol clock function from said sampled QAM signal further includes the step of:

(B1) determining for each sample an optimum sampling point located in the center of said current sampled QAM signal.

3. The method of claim 1, wherein said step (B) of recovering said symbol clock function from said sampled QAM signal further includes the step of:

(B2) interpolating between at least two preceding sampled QAM signals.

4. The method of claim 1, wherein said step (F) of using said linear phase detector to obtain said instantaneous phase angle error for each said symbol clock further includes the step of:

obtaining said instantaneous phase angle error for each said symbol clock in a Decision Directed Equalization (DDE) mode.

5. The method of claim 1, wherein said step (F) of using said linear phase detector to obtain said instantaneous phase angle error for each said symbol clock further includes the step of:

obtaining said instantaneous phase angle error for each said symbol clock in a Blind Equalization (BE) mode.

6. The method of claim 1, wherein said carrier frequency loop further includes a 1-st order Phase (P) carrier frequency loop, and wherein said step (G) of averaging said phase angle error by using said carrier loop filter further includes the step of:

determining a set of (P)-phase coefficients for said carrier loop filter by using a state machine depending on clock counts, a measured average constellation error, and at least one error threshold.

7. The method of claim 1, wherein said carrier frequency loop further includes a 2-nd order Phase-Integration (PI) carrier frequency loop, and wherein said step (G) of averaging said phase angle error by using said carrier loop filter further includes the step of:

determining a set of (P)-phase and (I)-integration coefficients for said 2-nd order Phase-Integration (PI) carrier frequency loop by using a state machine depending on clock counts, a measured average constellation error, and at least one error threshold.

8. The method of claim 1, wherein said carrier frequency loop further includes a 3-d order Phase-Integration-Derivative (PID) carrier frequency loop, and wherein said step (G) of averaging said phase angle error by using said carrier loop filter further includes the step of:

determining a set of (P)-phase, (I)-integration, and (D)-derivative coefficients for said 3-d order Phase-Integration-Derivative (PID) carrier frequency loop by using a state machine depending on clock counts, a measured average constellation error, and at least one error threshold.

9. The method of claim 1, wherein said step (E) of using said complex conjugate multiplier to obtain said phase angle error for each said symbol clock further includes the step of:

averaging a DC offset correction for said sampled QAM BE signal by averaging said DC offset in said I channel to obtain an $I_{DC}$ offset and by averaging said DC offset in said Q channel to obtain a $Q_{DC}$ offset.

10. The method of claim 1, wherein said step (F) of computing said instantaneous phase angle error used by said carrier loop filter further includes the step of:

using a quasi-linear phase detector.

11. The method of claim 1, wherein said step (F) of computing said instantaneous phase angle error used by said carrier loop filter further includes the step of:

using a quasi-linear phase detector to approximate said phase angle error signal as a one-bit directional error step function.

12. The method of claim 1, wherein said step (F) of computing said instantaneous phase angle error used by said carrier loop filter further includes the step of:

using a quasi-linear phase detector to approximate said phase angle error signal as a multi-bit function.

13. The method of claim 1, wherein said step (F) of computing said instantaneous phase angle error used by said carrier loop filter further includes the step of:

using a quasi-linear phase detector to approximate said phase angle error signal as a multi-bit $\tan^{-1}$ function.

14. The method of claim 13, wherein said step of using said quasi-linear phase detector to approximate said phase angle error signal as said multi-bit $\tan^{-1}$ function further includes the steps of:

normalizing I and Q components of said phase angle error signal;

reciprocating (inversing) said normalized I component of said phase angle error signal;

multiplying said normalized Q component of said phase angle error signal and inversed normalized I component of said phase angle error signal; and approximating said multi-bit $\tan^{-1}$ function by said normalized Q component of said phase angle error signal multiplied by said inversed normalized I component of said phase angle error signal.

15. The method of claim 1, wherein said step (F) of computing said instantaneous phase angle error used by said carrier loop filter further includes the step of:

setting a variable bandwidth of said carrier loop filter in order to minimize said carrier loop filter bandwidth and in order to optimize the bit error rate (BER).

16. The method of claim 15, wherein said carrier frequency loop further includes a 3-d order Phase-Integration-Derivative (PID) carrier frequency loop, and wherein said step of setting said variable bandwidth of said carrier loop filter further includes the step of:

selecting an initial set of PID coefficients by using said state machine to set said variable bandwidth of said carrier loop filter to be higher than a frequency uncertainty during a QAM signal acquisition state of said QAM demodulator; and adjusting said initially selected set of PID coefficients by using said state machine in order to decrease said initially set bandwidth of said carrier loop filter in incremental stages to be less than said frequency uncertainty during a carrier tracking state of said QAM demodulator.

17. The method of claim 15, wherein said step of setting said variable bandwidth of said carrier loop filter further includes the steps of:

monitoring an average QAM constellation phase angle error;

obtaining an average amplitude error power of said QAM constellation; and switching said bandwidth to a lower value based on said average power of said constellation by using said state machine.

18. The method of claim 17, wherein said step of obtaining said average amplitude error power of said QAM constellation further includes the step of:

performing an exponential averaging to get said average amplitude error power of said QAM constellation.

19. The method of claim 15, wherein said step of setting said variable bandwidth of said carrier loop filter further includes the steps of:

(A) starting with a first set of coefficients of said carrier frequency loop in said state machine corresponding to a normal set of input code words;

(B) detecting a burst set of input code words;

(C) selecting a second set of coefficients of said carrier frequency loop in said state machine corresponding to said burst set of input code words for a predetermined amount of time to switch said QAM modem to a burst mode of operation;

(D) switching said state machine back so that to set said carrier frequency loop includes said first set of coefficients after said burst mode is over; and (E) repeating said steps (A–D).

20. An apparatus for robust carrier recovery in a QAM demodulator, said apparatus comprising:

a sampling block configured to sample a QAM signal received from a transmission channel;

a symbol clock recovery block coupled to said sampling block; said symbol clock recovery block configured to recover a symbol clock function from said sampled QAM signal;

an adaptive equalizer coupled to said symbol clock recovery block; said adaptive equalizer configured to transform said sampled QAM signal into a QAM equalized signal in a Blind Equalization (BE) mode;

a slicer configured to locate a nearest plant point for said QAM Blind equalized signal for each said recovered symbol clock;

a complex conjugate multiplier coupled to said slicer, said complex conjugate multiplier configured to obtain an instantaneous inphase component and an instantaneous quadrature component of a phase angle error signal by comparing an inphase component and a quadrature component of said QAM Blind equalized signal and an inphase and a quadrature component of said nearest plant point for each said symbol clock;

a linear phase detector configured to translate said inphase component and said quadrature component of said phase angle error signal into an instantaneous phase angle error for each said symbol clock;

a carrier loop filter configured to average said instantaneous phase angle error signal; and a complex multiplier configured to insert an inverse of said averaged phase angle error signal into said QAM Blind equalized signal to compensate for said carrier phase angle error;

wherein said QAM input signal includes an input carrier frequency within an acquisition bandwidth of said carrier frequency loop.

21. The apparatus of claim 20, wherein said linear phase detector further includes:
an algorithm configured obtain said instantaneous phase angle error for each said symbol clock in a Decision Directed Equalization (DDE) mode.

22. The apparatus of claim 20, wherein said linear phase detector further includes:
an algorithm configured obtain said instantaneous phase angle error for each said symbol clock in a Blind Equalization (BE) mode.

23. The apparatus of claim 20, further including:
a state machine configured to pre-compute a set of (P)-phase coefficients for said carrier loop filter by utilizing a set of clock counts, a measured average constellation error, and at least one error threshold.

24. The apparatus of claim 20 further including:
a state machine configured to pre-compute a set of (P)-phase and (I)-integration coefficients for said 2-nd order Phase-Integration (PI) carrier frequency loop by utilizing a set of clock counts, a measured average constellation error, and at least one error threshold.

25. The apparatus of claim 20 further including:
a state machine configured to pre-compute a set of (P)-phase, (I)-integration, and (D)-derivative coefficients for said 3-d order Phase-Integration-Derivative (PID) carrier loop by utilizing a set of clock counts, a measured average constellation error, and at least one error threshold.

26. The apparatus of claim 25, wherein said carrier frequency loop further includes a 3-d order Phase-Integration-Derivative (PID) carrier frequency loop further including:
a state machine further including:
a first bank of PID coefficients; and
a second bank of PID coefficients;
wherein said first bank of PID is used to initially set a variable bandwidth of said carrier loop filter to be higher than a frequency uncertainty during a QAM signal acquisition state of said QAM demodulator;
and wherein said second bank of PID coefficients is used to decrease said initially set bandwidth of said carrier loop filter in incremental stages to be less than said frequency uncertainty during a carrier tracking state of said QAM demodulator.

27. The apparatus of claim 25, wherein said carrier frequency loop further includes a 3-d order Phase-Integration-Derivative (PID) carrier frequency loop further including:
a state machine further including:
an average algorithm comprising the following steps:
monitoring an average QAM constellation phase angle error;
obtaining an average amplitude error power of said QAM constellation; and
switching said bandwidth to a lower value based on said average power of said constellation.

28. The apparatus of claim 25, wherein said carrier frequency loop further includes a 3-d order Phase-Integration-Derivative (PID) carrier frequency loop further including:
a state machine further including:
an exponential averaging algorithm comprising the following steps:
monitoring an average QAM constellation phase angle error;
performing an exponential averaging to get an average amplitude error power of said QAM constellation; and
switching said bandwidth to a lower value based on said average power of said constellation.

29. The apparatus of claim 20, wherein said linear phase detector further includes:
a one-bit quasi-linear phase detector configured to approximate said phase angle error signal as a one-bit directional error step function.

30. The apparatus of claim 20, wherein said linear phase detector further includes:
a multi-bit quasi-linear phase detector configured to approximate said phase angle error signal as a multi-bit directional error step function.

31. The apparatus of claim 30, wherein said multi-bit quasi-linear phase detector further including:
a multi-bit $\tan^{-1}$ function quasi-linear phase detector configured to approximate said phase angle error signal as a multi-bit $\tan^{-1}$ function.

32. The apparatus of claim 31, wherein said multi-bit $\tan^{-1}$ function quasi-linear phase detector configured to approximate said phase angle error signal as said multi-bit $\tan^{-1}$ function further includes:
an algorithm comprising the following steps:
(A) normalizing I and Q components of said phase angle error signal;
(B) reciprocating (inversing) said normalized I component of said phase angle error signal;
(C) multiplying said normalized Q component of said phase angle error signal and inversed normalized I component of said phase angle error signal; and
(D) approximating said multi-bit $\tan^{-1}$ function by said normalized Q component of said phase angle error signal multiplied by said inversed normalized I component of said phase angle error signal.

33. An apparatus for robust carrier recovery in a QAM demodulator, said apparatus comprising:
a means for sampling a QAM signal received from a transmission channel;
a means for performing a symbol clock recovery function from said sampled QAM signal;
a means for transforming said sampled QAM signal into a QAM equalized signal in a Blind Equalization (BE) mode; and
a state machine configured to determine a set of (P)-phase coefficients for a 1-st order Phase (P) carrier frequency loop by utilizing a set of clock counts, a measured average constellation error, and at least one error threshold;
wherein said QAM input signal includes an input carrier frequency within an acquisition bandwidth of said carrier frequency loop.

34. An apparatus for robust carrier recovery in a QAM demodulator, said apparatus comprising:
a means for sampling a QAM signal received from a transmission channel;
a means for performing a symbol clock recovery function from said sampled QAM signal;
a means for transforming said sampled QAM signal into a QAM equalized signal in a Blind Equalization (BE) mode; and a state machine configured to determine a set of (P)-phase and (I)-integration coefficients for said 2-nd order Phase-Integration (PI) carrier frequency loop by utilizing a set of clock counts, a measured average constellation error, and at least one error threshold;

wherein said QAM input signal includes an input carrier frequency within an acquisition bandwidth of said carrier frequency loop.

35. An apparatus for robust carrier recovery in a QAM demodulator, said apparatus comprising:

a means for sampling a QAM signal received from a transmission channel;

a means for performing a symbol clock recovery function from said sampled QAM signal;

a means for transforming said sampled QAM signal into a QAM equalized signal in a Blind Equalization (BE) mode; and a state machine configured to determine a set of (P)-phase, (I)-integration, and (D)-derivative coefficients for said 3-d order Phase-Integration-Derivative (PID) carrier frequency loop by utilizing a set of clock counts, a measured average constellation error, and at least one error threshold;

wherein said QAM input signal includes an input carrier frequency within an acquisition bandwidth of said carrier frequency loop.

* * * * *